United States Patent
Suhara et al.

(10) Patent No.: US 6,931,716 B2
(45) Date of Patent: Aug. 23, 2005

(54) ELECTRIC-COMPONENT MOUNTING SYSTEM

(75) Inventors: Shinsuke Suhara, Kariya (JP); Mitsutaka Inagaki, Anjo (JP); Toshiya Ito, Nishio (JP); Yusuke Tsuchiya, Toyota (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 444 days.

(21) Appl. No.: 10/104,036

(22) Filed: Mar. 25, 2002

(65) Prior Publication Data

US 2002/0138974 A1 Oct. 3, 2002

(30) Foreign Application Priority Data

Apr. 2, 2001 (JP) ........................................ 2001-102972

(51) Int. Cl.[7] ................................................. H05K 3/32
(52) U.S. Cl. ............................ 29/740; 29/741; 29/721; 29/720; 29/DIG. 44; 29/833; 382/141
(58) Field of Search ................................ 382/292, 141; 29/740, 743, 720, 721, 705, 833, 714–719; 414/737, 416; 901/40, 47

(56) References Cited

U.S. PATENT DOCUMENTS 5,926,950 A    7/1999   Asai et al.
6,739,036 B2 *   5/2004   Koike et al. .................. 29/743
6,769,172 B2 *   8/2004   Suhara et al. ................. 29/740

FOREIGN PATENT DOCUMENTS

| JP | B2 2-57719 | 12/1990 |
| JP | A 6-342998 | 12/1994 |
| JP | A 9-237997 | 9/1997 |
| JP | A 2000-151199 | 5/2000 |

OTHER PUBLICATIONS

U.S. Appl. No. 10/041,624, filed Jan. 10, 2002, Isogai et al.

* cited by examiner

Primary Examiner—Minh Trinh
(74) Attorney, Agent, or Firm—Oliff & Berridge, PLC

(57) ABSTRACT

In an electric-component mounting system including an illuminating device including a light source which emits a light for illuminating an object, a camera which takes an image of the object, and a processing and controlling device which includes a data processing portion that processes image data representing the image of the object taken by the camera, at least one of the camera and the illuminating device includes a brightness controlling device which controls a brightness of an image taken by the camera, and the processing and controlling device includes a brightness detecting portion which detects a brightness of at least a portion of the image of the object taken by the camera, and a control-parameter varying portion which varies, based on the brightness detected by the brightness detecting portion, at least one control parameter of the brightness controlling device so that a brightness of at least a portion of an image taken by the camera is equal to a preset brightness.

12 Claims, 10 Drawing Sheets

ELECTRIC-COMPONENT MOUNTING SYSTEM

BACKGROUND OF THE INVENTION

1. Field of the Invention

The present invention relates in general to an image taking system and more particularly to the art of taking images with stable brightness.

1. Discussion of Related Art

There is known an image taking system which is employed in an electric-component mounting system for mounting electric components (in particular, electronic components) on a printed-wiring board, and which takes an image of an electric component held by an electric-component holder and detects, based on the taken image, a position, a posture, a shape, and/or a type of the electric component. The conventional image taking system usually includes an illuminating device and an image taking device, and repeats image taking actions by controlling those devices under pre-set control conditions. While the illuminating device is new, the device can emit a light having a sufficiently high intensity. However, as time elapses, a light source of the illuminating device deteriorates, and the intensity of light emitted by the device decreases. If the image taking system employing the light source which deteriorates as time elapses, repeats image taking actions under the preset control conditions, respective images repeatedly taken by the system will be gradually darker as the intensity of light emitted by the light source decreases. If a taken image is dark as a whole, it is difficult to accurately determine, in the image, a boundary line between a bright area and a dark area, i.e., an edge line between the object (the electric component) and its background. If the light source has deteriorated and the intensity of light emitted thereby has decreased, the light source may be exchanged with a new one. In this case, however, the frequency of exchanging of light sources increases, which leads to increasing the running cost of the image taking system. In addition, since the operation of the image taking system and accordingly the electric-component mounting system must be suspended when the light sources are exchanged, the operation efficiency of the mounting system decreases.

The above explanation is not limited to the image taking system employed in the electric-component mounting system, but applies to other image taking systems.

SUMMARY OF THE INVENTION

It is therefore an object of the present invention to stabilize the brightness of an image taken by an image taking device. This object may be achieved according to any one of the following modes of the present invention in the form of an image taking system, an image-taking-system control program, and an electric-component mounting system, each of which is numbered like the appended claims and depends from the other mode or modes, where appropriate, to indicate and clarify possible combinations of elements or technical features. It is to be understood that the present invention is not limited to the technical features or any combinations thereof which will be described for illustrative purposes only. It is to be further understood that a plurality of elements or features included in any one of the following modes of the invention are not necessarily provided altogether, and that the invention may be embodied without some of the elements or features described with respect to the same mode.

(1) An image taking system, comprising:

an illuminating device including a light source which emits a light for illuminating an object;

a camera which takes an image of the object;

a processing and controlling device which includes a data processing portion that processes image data representing the image of the object taken by the camera;

at least one of the camera and the illuminating device comprising a brightness controlling device which controls a brightness of an image taken by the camera; and the processing and controlling device comprising a brightness detecting portion which detects a brightness of at least a portion of the image of the object taken by the camera, and a control-parameter varying portion which varies, based on the brightness detected by the brightness detecting portion, at least one control parameter of the brightness controlling device so that a brightness of at least a portion of an image taken by the camera is equal to a preset brightness.

The present image taking system includes the brightness controlling device and the brightness detecting portion, and the brightness detecting portion monitors a brightness of a taken image. In addition, the control-parameter varying portion varies one or more control parameters of the brightness controlling device, so that a brightness of a taken image is kept equal to a preset brightness. Since each taken image has a stable brightness, a boundary between an object and its background in the each image is sufficiently clear, and accordingly useful information about the object can be obtained as a result of processing of the each image. Moreover, a cycle time at which light sources are exchanged is prolonged.

A brightness detecting operation may be performed each time an image of an object is taken. However, it is preferred to perform those operations at intervals of considerably long time. An image a brightness of which is detected by the brightness detecting portion may be one which is taken for this purpose, i.e., the detection of brightness, or one which is taken for a different purpose.

It is preferred that a brightness detected by the brightness detecting portion be an average brightness of a prescribed portion (e.g., a portion of the object, or a portion of the background) of the taken image. However, it is possible to detect a brightness of the most bright picture element of the taken image, or an average brightness of the most bright and most dark picture elements of the taken image, or otherwise a different sort of brightness. Moreover, the brightness may be obtained as a digital value resulting from the processing of the image data by the data processing portion, or an analogue value, such an output voltage of the camera, before the processing.

In addition, the control-parameter varying portion may vary one or more control parameters of the brightness controlling device, each time the brightness detecting portion detects a brightness, or alternatively, only when a prescribed condition is satisfied. In the latter case, for example, one or more control parameters of the brightness controlling device is or are varied when the detected brightness is lower than the preset value.

(2) An image taking system according to the first mode (1), wherein the brightness controlling device comprises a camera controlling portion which controls at least one of a shutter speed of the camera, an amount of opening of a diaphragm of the camera, and a gain of an amplifier of the camera.

The present image taking system may be so modified as to control the light source as well. However, if the light source is one which emits a light whose intensity is constant, the present system can enjoy a simple construction.

(3) An image taking system according to the first or second mode (1) or (2), wherein the brightness controlling device comprises a light-source controlling portion which controls at least one of an electric voltage applied to the light source and an electric current supplied to the light source.

A brightness of a taken image is changed by controlling or changing the electric voltage applied to the light source, or the electric current supplied to the light source, and thereby changing an intensity of the light emitted by the light source.

(4) An image taking system according to any of the first to third features (1) to (3), wherein the illuminating device comprises a back-side illuminating device which illuminates a back side of the object and the camera takes a silhouette image of the object, and wherein the brightness detecting portion detects a brightness of at least a portion of a bright background of the silhouette image taken by the camera.

When image-taking conditions under which images are taken, for example, an intensity of the light emitted by the light source, have changed, such a tendency is found that a greater change of brightness occurs to a bright portion of each taken image than a change of brightness that occurs to a dark portion of the same. Since the present image taking system employs, as the illuminating device, the back-side illuminating device, the taken image includes a dark portion corresponding to the object and a bright portion corresponding to the background. Thus, the change of the image-taking conditions can be easily and accurately detected by detecting a brightness of the bright background.

More specifically described, it is preferable to detect, according to the fifth mode (5) described below, a brightness of the bright background only; and it is more preferable to detect an average brightness of the bright background only. However, it is possible to detect a brightness of the most bright picture element of the bright background, or a different sort of brightness.

Moreover, it is possible to detect a brightness of a portion including an area other than the bright background, such as a brightness of a portion including the silhouette image. More specifically described, it is possible to detect a brightness of the taken image as a whole, or a brightness of only a portion of the taken image. In this case, however, it is preferable to take an image of a specified object. For example, in the case where the present image taking system is employed in an electriccomponent mounting system so as to take an image of an electric component held by a suction nozzle, it is preferable to take an image of a specified or selected sort of electric component, or take an image of the suction nozzle not holding an electric component. That is, it is preferable to take an image in which an object occupies a specified area.

(5) An image taking system according to the fourth feature (4), wherein the brightness detecting portion detects an average brightness of the bright background of the silhouette image.

The average brightness of the bright background is not influenced by the object. It is possible to detect an average brightness of an entirety of the bright background, or an average brightness of only a portion of the bright background. In the former case, it is possible to remove, from the taken image, a portion which is determined, as a result of processing of the taken image, as corresponding to the object, or to beforehand remove, from the taken image, a portion which is expected to correspond to the object.

(6) An image taking system according to any of the first to third modes (1) to (3), wherein the illuminating device comprises a front-side illuminating device which illuminates a front side of the object and the camera takes a front image of the object that is formed by a light reflected from the front side of the object, and wherein the brightness detecting portion detects a brightness of at least a portion of a bright object-corresponding portion of the front image of the object taken by the camera.

The present image taking system employs, as the illuminating device, the front-side illuminating device which takes a front image including a bright portion corresponding to the object and a dark portion corresponding to the background. It is possible to detect an average brightness of the bright object-corresponding portion, or a brightness of the most bright picture element of the bright portion, or an average brightness of the most bright and most dark picture elements of the bright portion. According to this mode, it is preferable to employ such an object which has a large surface whose image is to be taken to detect its brightness; and it is more preferable to employ an object, such as a reflecting surface, which has so large a surface that an image thereof occupies an entirety of an image-forming area of the camera.

(7) An image taking system according to the sixth mode (6), wherein the brightness detecting portion detects an average brightness of the bright object-corresponding portion of the front image of the object.

In the case where the object is one whose front surface has a substantially uniform optical property, the intensity of the light emitted by the light source can be accurately detected. In a particular case where the object is one whose image occupies the entire image-forming area of the camera, an average brightness of the entire image taken by the camera may be detected easily, i.e., without needing to process the image beforehand to determine a boundary line of a portion corresponding to the object. According to this mode, too, it is possible to detect an average brightness of an entirety of the object-corresponding portion, or an average brightness of only a portion of the same.

(8) An image taking system according to any of the first to seventh modes (1) to (7), wherein the brightness detecting portion detects, as the brightness, an average of respective gray-scale values of respective picture elements of the portion of the image of the object taken by the camera.

A brightness may otherwise be detected as an analogue value based on, e.g., an output voltage of the camera that corresponds to each picture element of the image taken by the camera. In contrast, according to the present mode, a brightness is detected as a gray-scale value, i.e., a digital value obtained by processing the image. Thus, the data processing portion that processes the image can be effectively utilized to detect the brightness.

(9) An image taking system according to any of the first to fifth and eighth modes (1) to (5) and (8), wherein the illuminating device comprises the light source which emits an ultraviolet light; and a fluorescent surface which is provided in back of the object and which absorbs the ultraviolet light and emits a visible light toward the camera.

This illuminating device is a sort of the previously-described back-side illuminating device. The light source which emits the ultraviolet light is likely to deteriorate as time elapses. Therefore, the present invention is advantageously applicable to the present image taking system.

(10) An image taking system according to any of the first to ninth modes (1) to (9), wherein the control-parameter varying portion comprises an inspecting portion which operates the brightness controlling device under each of a plurality of different inspection values of the control parameter, so that the camera takes an image under the each of the different inspection values of the control parameter; and a relationship determining portion which determines, based on a brightness of at least a portion of each of the respective images taken by the camera under the different inspection values of the control parameter, a relationship between brightness and control parameter, wherein the control-parameter varying portion determines, according to the relationship, a value of the control parameter of the brightness controlling device so that a brightness of at least a portion of an image taken by the camera under the determined value of the control parameter is equal to the preset brightness.

Otherwise, the inspecting portion may operate the brightness controlling device under only a single inspection value of the control parameter, so that the camera takes a single image under the single inspection value of the control parameter. In contrast, according to the present mode wherein the inspecting portion operates the brightness controlling device under each of a plurality of different inspection values of the control parameter, the control-parameter varying portion can easily and accurately determine a value of the control parameter so that a brightness of an image taken by the camera under the determined value is equal to the preset brightness.

(11) An image taking system according to the tenth mode (10), wherein the inspecting portion operates the brightness controlling device under the each of the different inspection values of the control parameter that include a currently effective value of the control parameter and a value that differs by a preset amount from the currently effective value in a direction to increase a brightness of at least a portion of an image taken by the camera.

As image-taking operations are repeated without varying one or more preset control parameters, usually, respective brightness values of respective taken images gradually decrease, i.e., those taken images become darker one by one. Hence, according to the present mode, the inspecting portion operates the brightness controlling device under a currently effective value of the control parameter and a value that differs by a preset amount from the currently effective value in a direction to increase a brightness of a taken image, so that the relationship determining portion determines a relationship between brightness and control parameter. Thus, the relationship determining portion can determine a relationship between brightness and control parameter, based on the respective brightness values of the respective images taken by the camera under the inspection values of the control parameter that are sufficiently near to a new value of the control parameter that is to update the currently effective value. Thus, the control-parameter varying portion can accurately determine the new value of the control parameter according to the thus determined relationship. The preset amount by which the currently effective value is varied in a direction to increase a brightness of a taken image, may be an arbitrary amount. However, it is preferred that the preset amount be one which assures that the value obtained by varying the current value by the preset amount in the above direction results in taking an image whose brightness is higher than the preset brightness, because a relationship between brightness and control parameter is determined with respect to a brightness range within which the preset brightness falls.

(12) An image taking system according to any of the first, second, and fourth to eleventh modes (1), (2) and (4) to (11), wherein the brightness controlling device comprises a shutter of the camera, and wherein the at least one control parameter comprises a shutter speed of the camera.

The brightness controlling device may be a random shutter of a CCD camera. In the case where the control-parameter varying portion can change only the shutter speed of the camera, the relationship between brightness and shutter speed can be defined by a linear expression, and accordingly the varying portion can easily determine, according to the relationship, a new value of the control parameter that results in taking an image whose brightness is equal to the preset brightness.

(13) A control program for use in controlling an image taking system comprising an illuminating device including a light source which emits a light for illuminating an object, a camera which takes an image of the object, and a processing and controlling device which includes a data processing portion that processes image data representing the image of the object taken by the camera, at least one of the camera and the illuminating device comprising a brightness controlling device which controls a brightness of an image taken by the camera, the control program comprising the steps of detecting a brightness of at least a portion of the image of the object taken by the camera, and varying, based on the detected brightness, at least one control parameter of the brightness controlling device so that a brightness of at least a portion of an image taken by the camera is equal to a preset brightness.

The present control program may be modified according to any of the above-described second to twelfth modes (2) to (12). The present control program may be recorded on a recording medium such as a RAM or a ROM as part of a computer, and may be read by the computer or a CPU thereof to control the image taking system.

(14) An electric-component mounting system comprising:

a substrate supporting device which supports a circuit substrate;

a component supplying device which supplies an electric component;

a component mounting device including a suction nozzle which receives the electric component supplied by the component supplying device, and mounts the component on the circuit substrate supported by the substrate supporting device;

at least one of (a) a mark-image taking device which takes an image of at least one fiducial mark provided on the circuit substrate supported by the substrate supporting device and (b) a component-image taking device which takes an image of the electric component held by the suction nozzle;

a processing and controlling device which includes a data processing portion that processes image data representing the image taken by the at least one of the mark-image taking device and the component-image taking device, and which modifies, based on a result of processing of the image data by the data processing portion, a predetermined component-mounting program, and controls, according to the modified component-mounting program, the mounting of the electric component by the component mounting device on the circuit substrate;

the at least one of the mark-image taking device and the component-image taking device comprising an illuminating device including a light source which emits a light for illuminating an object, and a camera which takes an image of the object, at least one of the camera and the illuminating device comprising a brightness controlling device which controls a brightness of an image taken by the camera; and the processing and controlling device comprising a brightness detecting portion which detects a brightness of at least a portion of the image of the object taken by the camera, and a control-parameter varying portion which varies, based on the brightness detected by the brightness detecting portion, at least one control parameter of the brightness controlling device so that a brightness of at least a portion of an image taken by the camera is equal to a preset brightness.

The present electric-component mounting system may be modified according to any of the above-described second to twelfth features (2) to (12).

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which.

DETAILED DESCRIPTION OF THE PREFERRED EMBODIMENTS

Figure 1:
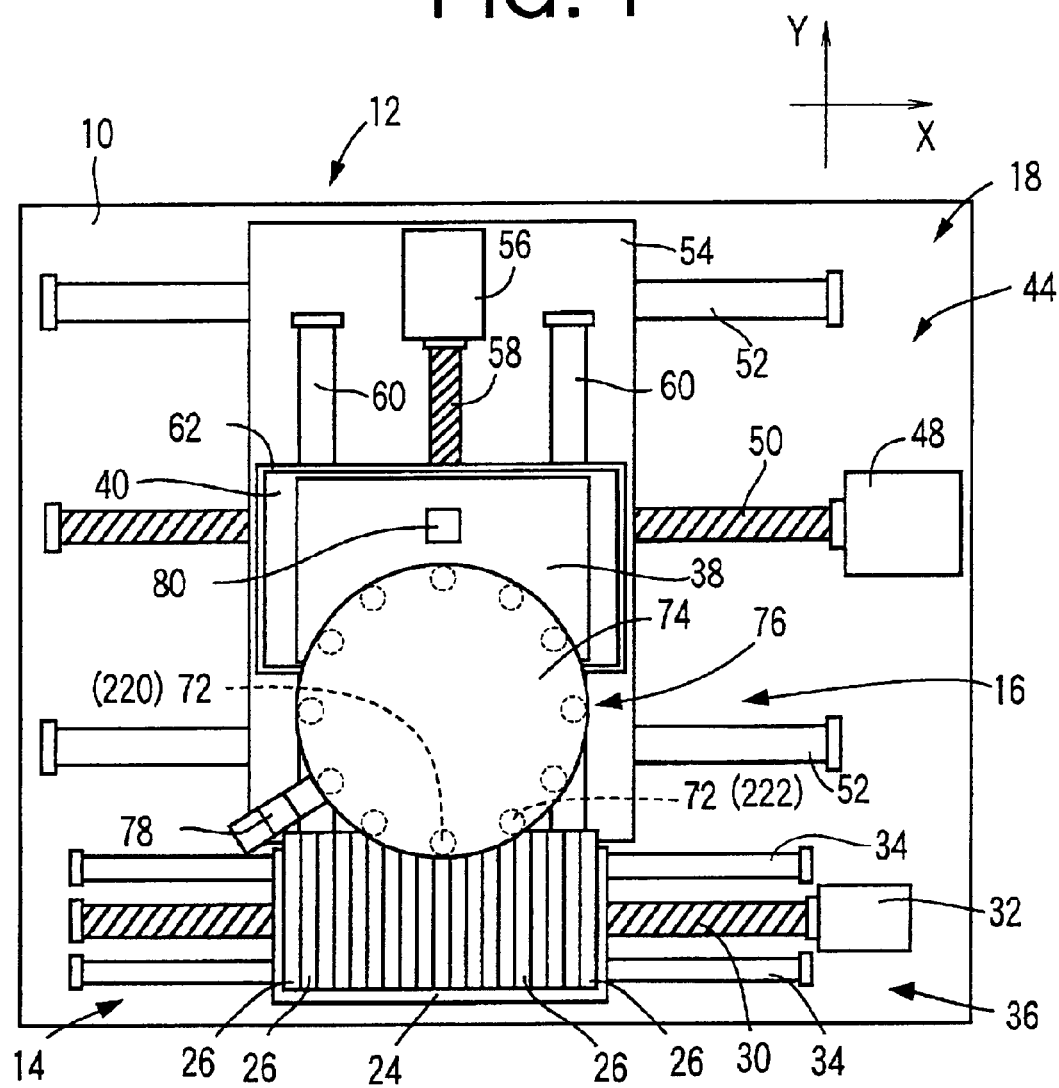
FIG. 1 is a plan view schematically showing an electronic-component mounting system including an image taking system constructed according to one embodiment of this invention.

Referring first to FIG. 1, reference numeral 10 denotes a machine base of an electric-component mounting system in the form of an electronic-component mounting system 12, which includes a component supply device 14, a component mounting device 16 and a printed-board supporting and moving device in the form of a printed-wiring-board supporting and moving device 18, which are all mounted on the machine base 10.

Figure 2:
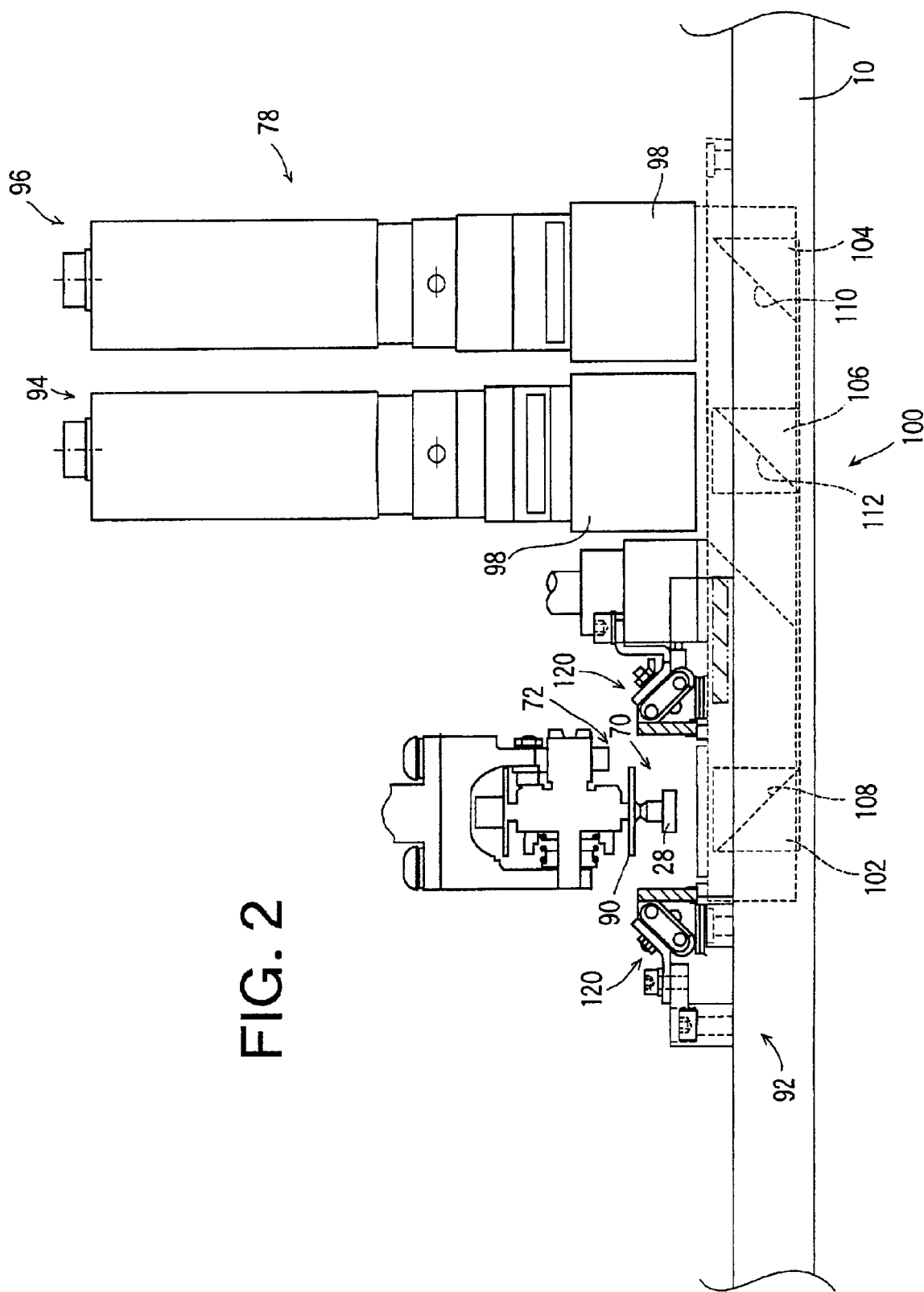
FIG. 2 is an enlarged, side elevational view showing a portion of the image taking system.

The component supply device 14 includes a plurality of tape feeders 26 mounted on a feeder support table 24. In the present embodiment, each of the tape feeders 26 is arranged to feed a carrier tape (not shown) which accommodates electric components in the form of electronic components 28, one of which is shown in FIG. 2. The carrier tape includes a carrier substrate which has a multiplicity of component-accommodating recesses formed at a suitable interval along the length of the tape. The electronic components 28 are accommodated in the respective component-accommodating recesses, and the opening of each recess is closed by a covering film bonded to the carrier substrate. The carrier tape is fed by a tape feeding device while the covering film is separated from the carrier substrate. Thus, the electronic components 38 are fed one after another to a predetermined position at a component-supply portion of the tape feeder 26. The plurality of tape feeders 26 are removably mounted on the feeder support table 24 such that the component-supply portions of the tape feeders 26 are arranged along a reference line, specifically, along a horizontal straight line in the present embodiment. The direction of extension of this straight line is referred to as an X-axis direction (right and left direction) as indicated in FIG. 1.

The feeder support table 24 is moved in the X-axis direction while being guided by a guiding device including a pair of guide rails 34, by rotation of a feedscrew in the form of a ballscrew 30 by a table drive motor 32, so that a selected one of the tape feeders 26 can be moved to a predetermined component-supply position. The ballscrew 30 and the table drive motor 32 cooperate to constitute a major portion of a table moving device.

The printed-wiring-board supporting and moving device 18 (hereinafter referred to as "PWB supporting and moving device") includes a printed-wiring-board supporting device (hereinafter referred to as "PWB supporting device") 40 arranged to support a printed-wiring board 38 on which the electronic components 28 are to be mounted, and a board moving device in the form of a printed-wiring-board moving device (hereinafter referred to as "PWB moving device") 44 arranged to move the PWB supporting device 40, for thereby moving the printed-wiring board 38. The PWB moving device 44 includes an X-axis slide 54, and a Y-axis slide 62 movably mounted on the X-axis slide 54. The X-axis slide 54 is movable in the X-axis direction by an X-axis drive motor 48 through a feedscrew in the form of a ballscrew 50 while being guided by a pair of guide rails 52, while the Y-axis slide 52 is movable in a Y-axis direction (perpendicular to the X-axis direction) by a Y-axis drive motor 56 through a feedscrew in the form of a ballscrew 58 while being guided by a pair of guide rails 60. The PWB supporting device 40 rests on the Y-axis slide 62, on which is placed the printed-wiring board 38 such that the board 38 maintains a horizontal attitude or posture in which a horizontal upper surface of the board 38 is parallel to an XY plane defined by the mutually perpendicular X-axis and Y-axis directions. The PWB supporting device 40 is moved by the PWB moving device 44 in the XY plane (the horizontal plane in the present embodiment), so that a selected portion of the upper surface of the printed-wiring board 38 is located at a predetermined component-mounting position described below.

The component mounting device 16 will be described only briefly since the component mounting device 16 is similar in construction to a component mounting device as disclosed in Japanese Patent Document No. 6-342998.

The component mounting device 16 includes a plurality of component holders 72 having respective suction nozzles (FIG. 2), and a nozzle moving device 76 which revolves the component holders 72 about an axis line and stops each of the holders 72 at a plurality of stop positions predetermined on a locus of removing movement of the holders 72. The nozzle moving device 76 includes an indexing table 74 which supports the component holders 72 altogether and which is intermittently rotated at a predetermined angular pitch about the above-indicated axis line. When the indexing table 74 is intermittently rotated at the angular pitch about the axis line, each of the component holders 72 is sequentially moved to, and stopped at, each of the above-indicated stop positions. Those stop positions includes a component-posture detecting position where a stationary image-taking device 78 including a component camera and a light guiding device is provided such that the image-taking device 78 is opposed to a free-end surface of the suction nozzle 70 of one component holder 72 being stopped at the stop position. The image-taking device 78 will be described in detail later. Above the image-taking device 78, there is provided a stationary holder-rotating device (not shown) which is opposed to the imagetaking device 78 via the component holder 72 and which rotates the holder 72. Another holder-rotating device is also provided at another or second stop position between the component-posture detecting position where the image-taking device 78 is provided, and a third stop position (hereinafter, referred to as the component mounting position) where the electronic component 28 is mounted on the printed-wiring board 38, for the purpose of correcting a possible angular-position error of the electronic component 28. Although not shown, there are additionally provided elevating and lowering devices for elevating and lowering each suction nozzle 70, and thereby holding and mounting each electronic component 28. Moreover, there is provided a stationary fiducial-mark camera 80 which is arranged to take images of fiducial marks affixed to the printed-wiring board 38 as held by the PWB supporting device 40. However, a holding device for holding the indexing table 74, the imagetaking device 78, and the fiducial-mark camera 80, is not shown for easier understanding purposes only.

Each of the suction nozzles 70 includes a main body, a suction pipe, and a luminescent plate (a fluorescent plate) 90. The luminescent plate 90 absorbs an ultraviolet light emitted by an ultraviolet-light emitting device 92 provided at the component-posture detecting device, and emits a visible light. Thus, the luminescent plate 90 functions as a luminescent body as a sort of light radiating device. A size of each suction nozzle 70 or its luminescent plate 90 corresponds to a size of an electronic component 28 to be held by the nozzle 70.

Next, there will be described the image-taking device 78.

As shown in FIG. 2, the image-taking device 78 includes two CCD cameras 94, 96, each as a component camera, that are arranged along a straight line passing through the axis line (centerline) of the indexing table 74 and the componentposture detecting position. The two CCD cameras 94, 96 are provided such that each camera is oriented in a vertically downward direction and can take an image of each electronic component 28 in the same state in which the component 28 is positioned at the component mounting position. Each of the two CCD cameras 94, 96 includes CCDs (charge-coupled devices) and a lens system. The CCDs are small-sized light-sensitive elements arranged in a matrix in a plane. Each of the light-sensitive elements generates an electric signal depending upon amount of light received. The matrix of the light-sensitive elements defines an imaging area in which a two-dimensional image of an object is formed at one time. The two CCD cameras 94, 96 have different focal distances, and takes respective images with different magnifying powers. Thus, the two CCD cameras 94, 96 are selectively used for taking images of comparatively small electronic components 28, and images of comparatively large electronic components 28, respectively. The two CCD cameras 94, 96 are connected to a control device 200, described later, so that the focus, diaphragm, and shutter speed of each CCD camera can be changed by the control device.

The above-mentioned light-guiding device 100 includes two reflecting mirrors 102, 104, each as a reflecting device, and a half mirror 106, and is fixed to the machine base 10. One 102 of the two reflecting mirrors 102, 104 includes a reflecting surface 108 which is provided right below the component-posture detecting position, such that the reflecting surface 108 is inclined by 45 degrees relative to a vertical plane including a centerline of the suction nozzle 70 being positioned at the detecting position, and that an outer end of the mirror 108 as viewed from the axis line of the indexing table 74 is lower than an inner end thereof. The other reflecting mirror 104 includes a reflecting surface 110 which is provided right below the more distant CCD camera 96 from the suction nozzle 70, such that the reflecting surface 110 is inclined symmetrically with the reflecting surface 108 of the one reflecting mirror 102, with respect to a vertical plane, and that a nearer end of the mirror 110 to the one mirror 102 is lower than an opposite end thereof. The half mirror 106 includes a reflecting surface 112 which is provided right below the nearer CCD camera 94 to the suction nozzle 70, such that the reflecting surface 112 is parallel to the reflecting surface 110.

The ultraviolet-light emitting device 92 includes a pair of light sources 120 which are fixed to the machine base 10 such that the two light sources 120 are opposed to each other via the electronic component 28 as the object. The two light sources 120 are provided at respective positions where the light sources 120 do not interfere with a locus of movement of each suction nozzle 70 or the electronic component 28 held by the each nozzle 70. In the present embodiment, a space present between the two light sources 120 is filled with the ultraviolet light emitted by the same 120. Therefore, when each suction nozzle 70 is positioned at a position between the two light sources 120, the luminescent plate 90 of the each nozzle 70 absorbs the ultraviolet light emitted by the light sources 120, and emits a visible light downward toward the electronic component 28 as the object whose image is to be taken. Thus, a back surface of the electronic component 28 as viewed from the image taking device 78 is illuminated by the visible light. Each of the light sources 120 is supplied with a rated current or voltage to emit an ultraviolet light having a prescribed intensity.

However, the ultraviolet-light emitting device 92 may employ a light source which emits an ultraviolet light whose intensity can be changed or adjusted by adjusting an electric current or voltage supplied thereto. In addition, the ultraviolet-light emitting device 92 may employ an annular light source. In the latter case, the annular light source is provided at a position lower than the electronic component 28 held by each suction nozzle 70, SO as to be prevented from interfering the component 28 or the nozzle 70.

The visible light emitted downward by the luminescent plate 90 is reflected and deflected by the reflecting mirror 102 into a horizontal light. A portion of the horizontal light is reflected vertically upward by the half mirror 104 so as to be incident to the first CCD camera 94, and the remaining light transmitted through the half mirror 104 is reflected vertically upward by the reflecting mirror 106 so as to be incident to the second CCD camera 96.

Figure 3:
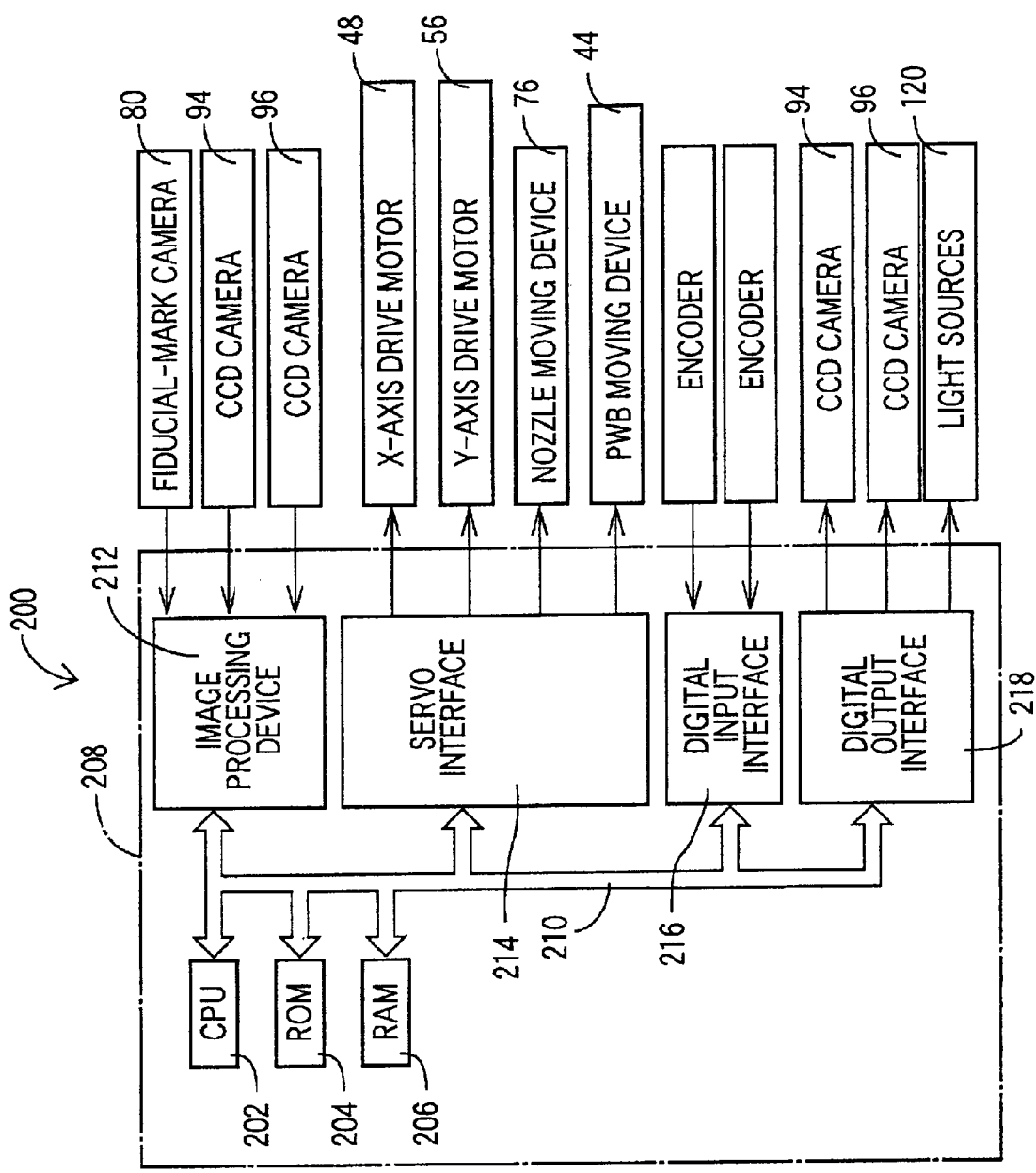
FIG. 3 is a block diagram illustrating a control device of the electronic-component mounting system.
Figure 4:
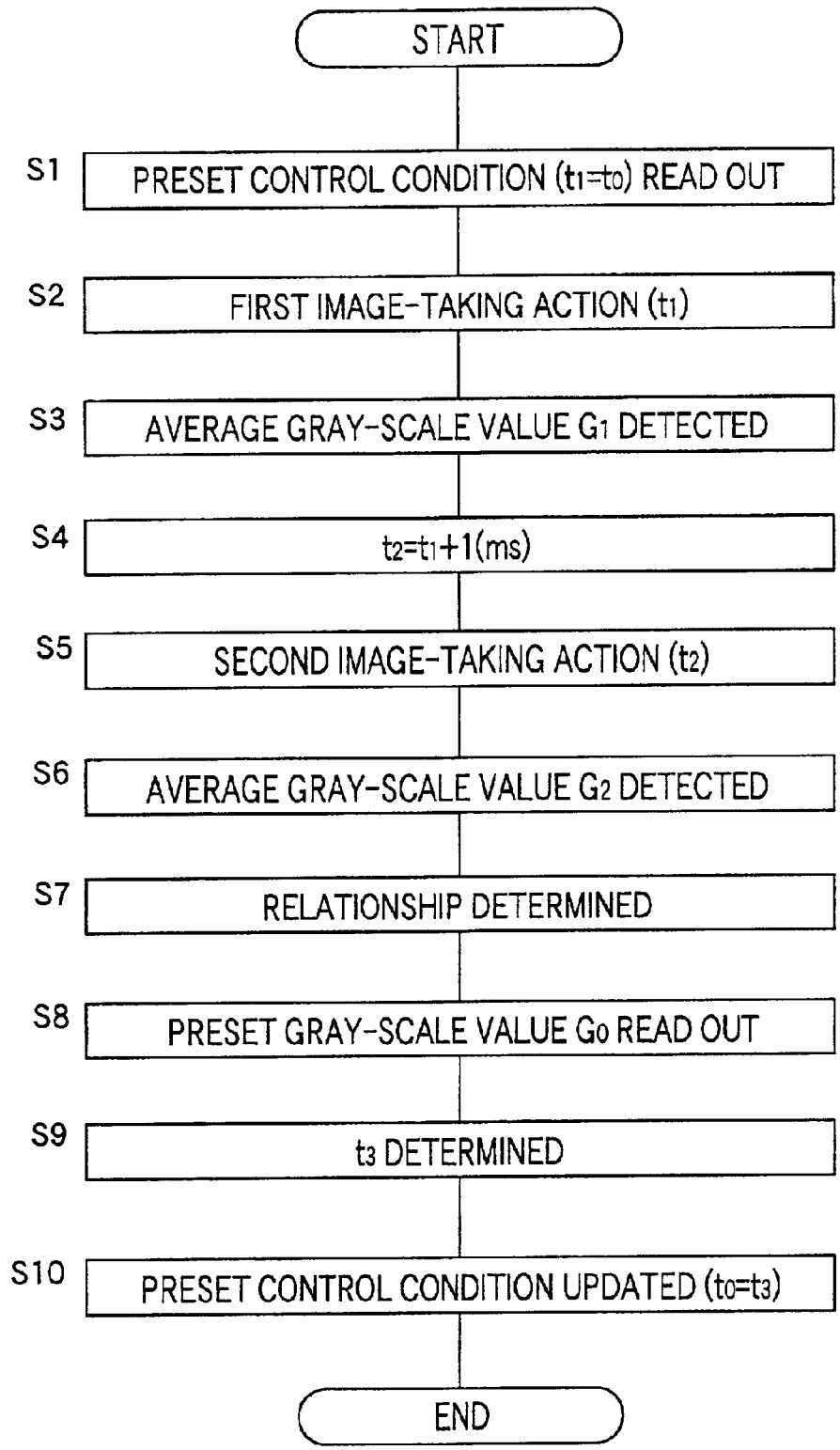
FIG. 4 is a flow chart representing a brightness detecting routine according to which a brightness is detected by the image taking system.
Figure 5:
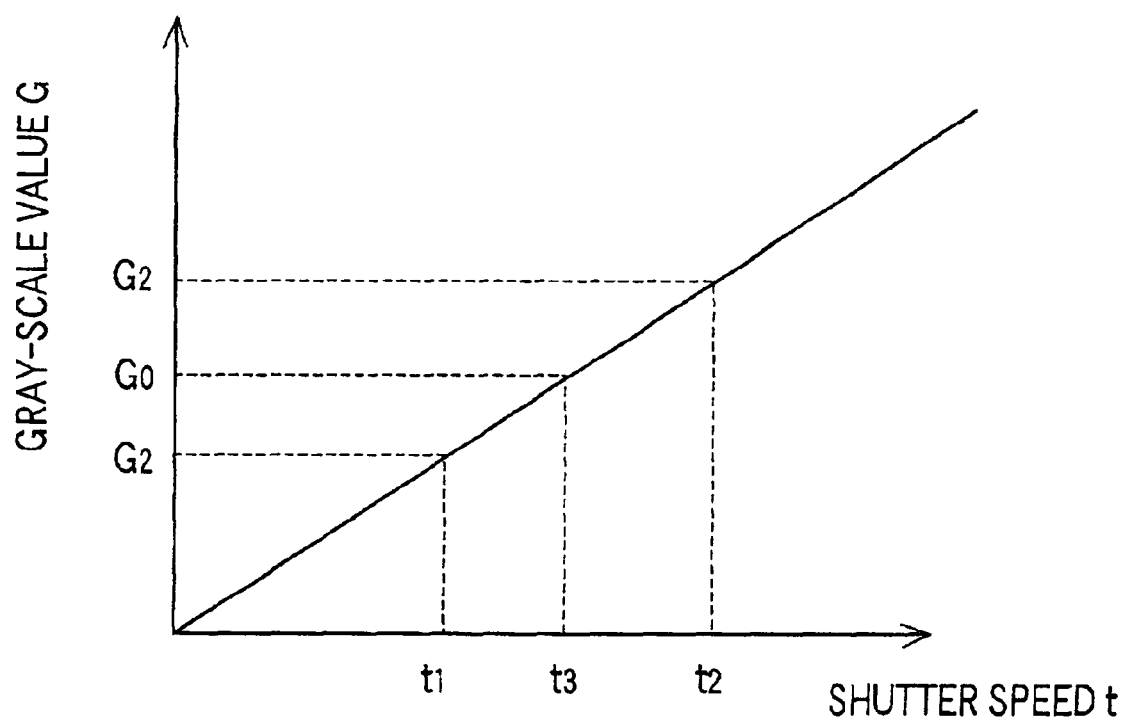
FIG. 5 is a graph showing a relationship between average gray-scale value of image taken by the image taking system, and shutter speed.

The present electronic-component mounting system 12 includes the control device 200, shown in FIG. 3, which is principally constituted by a computer 208 incorporating a central processing unit (CPU) 202, a read-only memory (ROM) 204, and a random-access memory (RAM) 206. In the RAM 206, there are stored various control programs including a mounting-operation control routine for controlling an electronic-component mounting operation; an image taking routine for taking an image of the electronic component 28 held by each suction nozzle 70, and detecting a posture of the component 28; and a brightness detecting routine, shown in FIG. 4, for detecting a brightness of a taken image. The CPU 202, the ROM 204, and the RAM 206 are connected to one another via a bus 210. The bus 210 is connected to (a) an image processing device 212 to which the image taking device 78 (the CCD cameras 94, 96) and the fiducial-mark camera 80 are connected, to (b) a servo interface 214 which are connected to the drive motors 48, 56, the PWV moving device 44, and the nozzle moving device 76, to (c) a digital input interface 216 to which respective encoders for monitoring respective rotations of those motors are connected, and to (d) a digital output interface 218 which is connected to the CCD cameras 94, 96 and the light sources 120.

In the present embodiment, the brightness detecting routine is implemented when the electronic-component mounting system 12 is routinely checked before its operation is started. First, the gist of a brightness detecting operation will be described. Upon commencement of operation of the electronic-component mounting system 12, the image taking device 78 and the ultraviolet emitting device 92 are controlled under respective current values of various control parameters, so as to perform a first image-taking action for the suction nozzle 70 being positioned at the component-posture detecting position at that time. Thus, the control device 200 obtains image data representing a first mage taken by the device 78. Next, the control device 200 increases only a current value of a shutter speed of the image taking device 78 as one of the control parameters, by a preset amount, e.g., several milliseconds, so as to perform a second image-taking action. Thus, the control device 200 obtains image data representing a second image taken by the device 78. That is, two image-taking actions are performed, for a same suction nozzle 70, under different values of one control parameter.

The control device 200 processes the two batches of image data representing the thus obtained two images, and determines an average gray-scale value as a brightness of each of the two images. Then, the control device 200 determines a linear expression representing a relationship between average grayscale value of image and shutter speed, and calculates, according to the thus determined relationship, a new value of the shutter speed that results in taking an image having an average gray-scale value equal to a preset gray-scale value. The control device 200 updates the shutter speed by replacing the current value thereof with the thus determined new value, so that subsequent component-posture detecting operations are performed by taking respective images of electronic components under the new value of the shutter speed (hereinafter, referred to as the posture-imaging operations). Hereinafter, the brightness detecting operation will be described in detail by reference to the flow chart shown in FIG. 4.

When an electric current is applied to the electronic-component mounting system 12 to start an operation thereof, the control device 200 implements the brightness detecting routine. Hereinafter, as far as the present embodiment is concerned, the following explanation refers to a shutter speed, t, of the image taking device 78 as a control parameter thereof.

At Step S1 (hereinafter, "Step" is omitted, if appropriate), the control device reads, from the RAM 206, a current value, $t_0$, of the shutter speed as a control parameter of the image taking device 78 and/or the ultraviolet-light emitting device 92, and sets the current value t0 of shutter speed as a shutter speed, $t_1$, for a first image-taking action. At S2, the first image-taking action is performed under the shutter speed $t_1$. In the present embodiment, the shutter speed t1 is set for the two CCD cameras 94, 96, independent of each other. At S3, the control device 200 reads image data representing a first image taken by the CCD camera 94 or 96, and processes the image data. More specifically described, the control device 200 removes, from the taken image, a first portion which is expected to contain an image of the suction nozzle 70 itself, and a second portion along an outer peripheral portion of the first portion, and detects respective gray-scale values of respective picture elements of the remaining portion of the taken image. Finally, the control device 200 determines an average, $G_1$, of the thus detected gray-scale values as a brightness of the taken image. Subsequently, at S4, the control device 200 newly sets a time obtained by adding one or more milliseconds to the shutter speed $t_1$, as a shutter speed, $t_2$, for a second image-taking action. Preferably, one millisecond is added to the first shutter speed $t_1$. At S5, the second imagetaking action is performed under the newly set shutter speed $t_2$. At S6, the control device 200 processes, like at S3, image data representing a second image taken at S5, and determines an average gray-scale value, $G_2$, from the second image.

At S7, the control device 200 determines, based on the two values $t_1$, $t_2$ of the shutter speed and the two average gray-scale values $G_1$, $G_2$, a relationship between average grayscale value G and shutter speed t.

More specifically described, the control device 200 determines a linear expression representing a straight line passing through the two coordinates $(G_1, t_1)$, $(G_2, t_2)$. At S8, the control device reads, from the RAM 206, a preset gray-scale value, $G_0$. At S9, the control device 200 newly determines, according to the linear expression determined at S7, a value, t3, of shutter speed that corresponds to the preset gray-scale value $G_0$. At S10, the control device 200 updates the shutter speed by replacing the current value $t_0$ thereof with the newly determined value $t_3$ thereof, so that the new shutter speed $t_3$ is used in each of subsequent posture-imaging operations. Thus, one control cycle according to the brightness detecting routine is finished. It has been described, for easier understanding purposes only, that the first or second image-taking action is followed by the corresponding image-processing operation. However, it is possible to perform the first or second image-taking action concurrently with the corresponding image-processing operation. In addition, it has been described that a single image-taking action is performed at each of the two shutter-speed values. However, in fact, a plurality of image-taking actions are performed at each of the different shutter-speed values, and an average gray-scale value for the each shutter-speed value is obtained as an average of respective average gray-scale values of respective images taken by those actions.

It emerges from the foregoing description that the present electronic-component mounting system 12 employs the luminescent plate 90 and the ultraviolet-light emitting device 92 which cooperate with each other to provide a back-side illuminating device as a sort of illuminating device. In addition, a portion of the control device 200 that carries out Steps S1 and S4 provides an inspecting portion; a portion of the control device 200 that carries out Step S7 provides a relationship determining portion; and a portion of the control device 200 that carries out Step S10 provides a control-parameter varying portion.

Even if the intensity of the light emitted by the light source may change, the present image taking system can take, in each posture-imaging operation, an image whose brightness is highly stable. Though the light source of the ultraviolet-light emitting device 92 tends to deteriorate and accordingly the intensity of light emitted by the light source tends to lower, the lowering of the light intensity can be compensated for by the adjusting of the shutter speed of each of the CCD cameras 94, 96. Since each taken image has a highly stable brightness, a clearly edge line of an image of the electronic component 28 can be determined with high stability, without being adversely influenced by unstable brightness. Thus, each taken image can be accurately processed. Though it has been a conventional practice to considerably frequently exchange light sources of the ultraviolet-light emitting device 92, so as to prevent lowering of accuracy of image processing, the present image taking system can reduce the frequency of exchanging of light sources, thereby contributing to lowering the running cost.

In the present embodiment, a brightness of an image is detected in terms of an average gray-scale value of the image. However, a brightness of an image is detected as an average value of respective output voltages of the image taking device 78 that correspond to respective picture elements of the image, or as a different sort of brightness. In addition, it is not essentially required to detect a brightness of an entirety of an image, and it is possible to detect a brightness of the most or least bright picture element of an image, or an average brightness of the most and least bright picture elements.

In the present embodiment, the shutter speed as one of the control parameters is varied to take an image whose brightness is equal to a preset brightness. However, it is possible to vary, for adjusting the brightness of an image, a different control parameter of the image taking device 78, such as an amount of opening of a diaphragm of a lens system or a gain of an amplifier of the camera. In addition, it is possible to vary two or more control parameters of the image taking device, in combination, so as to take an image having the preset brightness. In the last case, however, it is preferable to vary one control parameter each time one control-parameter varying operation is performed. More specifically described, for example, if the shutter speed is varied in the current control-parameter varying operation, to adjust the brightness of an image, the amount of opening of the diaphragm may be varied in the next control-parameter varying operation. Each control parameter may have an upper-limit value. In this case, if the shutter speed is varied to its upper-limit value in at least one control-parameter varying operation, then the amount of opening of the diaphragm may be varied in one or more following control-parameter varying operations; and if the opening amount of the diaphragm is varied to its upper-limit value, then the gain of the amplifier may be varied in one or more following control-parameter varying operations. In this method, since only one control parameter is varied in one control-parameter varying operation, the relationship between brightness and control parameter can be easily determined.

Moreover, in the present embodiment, the ultraviolet-light emitting device 92 does not have a function of adjusting the brightness of a taken image. However, it is possible to adjust the brightness by controlling an electric voltage applied to the device 92 or an electric current supplied to the same 92. In this case, it is possible to vary, in place of, or in addition to, one or more control parameters of the image taking device 78, one or more control parameters of the ultraviolet-light emitting device 92.

The present electronic-component mounting system 12 may be so modified as to implement the brightness detecting operation at a time other than the time when the operation of the mounting system 12 is started. For example, the mounting system 12 may implement the bright detecting operation during the electronic-component mounting operation. To this end, the mounting system 12 monitors or measures a time duration which has passed from the time when the last brightness detecting operation was performed and, if it is found that a preset time has passed, the system 12 implements another brightness detecting operation.

In this modified embodiment, each brightness detecting operation is performed at a timing when it does not interfere with the electronic-component mounting operation. To this end, the electronic-component mounting system 12 employs a timer which measures a passing time and, when the timer commands a commencement of the brightness detecting routine, the mounting system 12 waits for ending of the current supplying operation to supply electronic components 28 to the current printed-wiring board 38 so that those components 28 are mounted on the board 38. After the current supplying operation has ended, the two successive suction nozzles 70 which are subsequently positioned at the component supplying position, are moved to the component-posture detecting position, without having receiving an electronic component 28. When the first one of the two suction nozzles 70 is moved to, and stopped, at the component-posture detecting position, the first nozzle 70 and the corresponding luminescent plate 90 are subjected to a first image-taking action under the currently effective value ($t_1=t_0$) of the shutter speed as one of the control parameters. Then, the indexing table 74 is rotated by one angular pitch, the second suction nozzle 70 is moved to, and stopped at, the component-posture detecting position, so that the second nozzle 70 is subjected to a second image-taking action ($t_1=t_0$). The thus taken two images are processed in the same manner as that employed in the preceding embodiment, and a new value $t_3$ of the shutter speed is determined and set. Thus, one brightness detecting operation is finished, and the electronic-component mounting operation is resumed to mount electronic components 28 on a new printed-wiring board 38 while taking respective images of the components 28 under the new value $t_3$ of the shutter speed.

Figure 6:
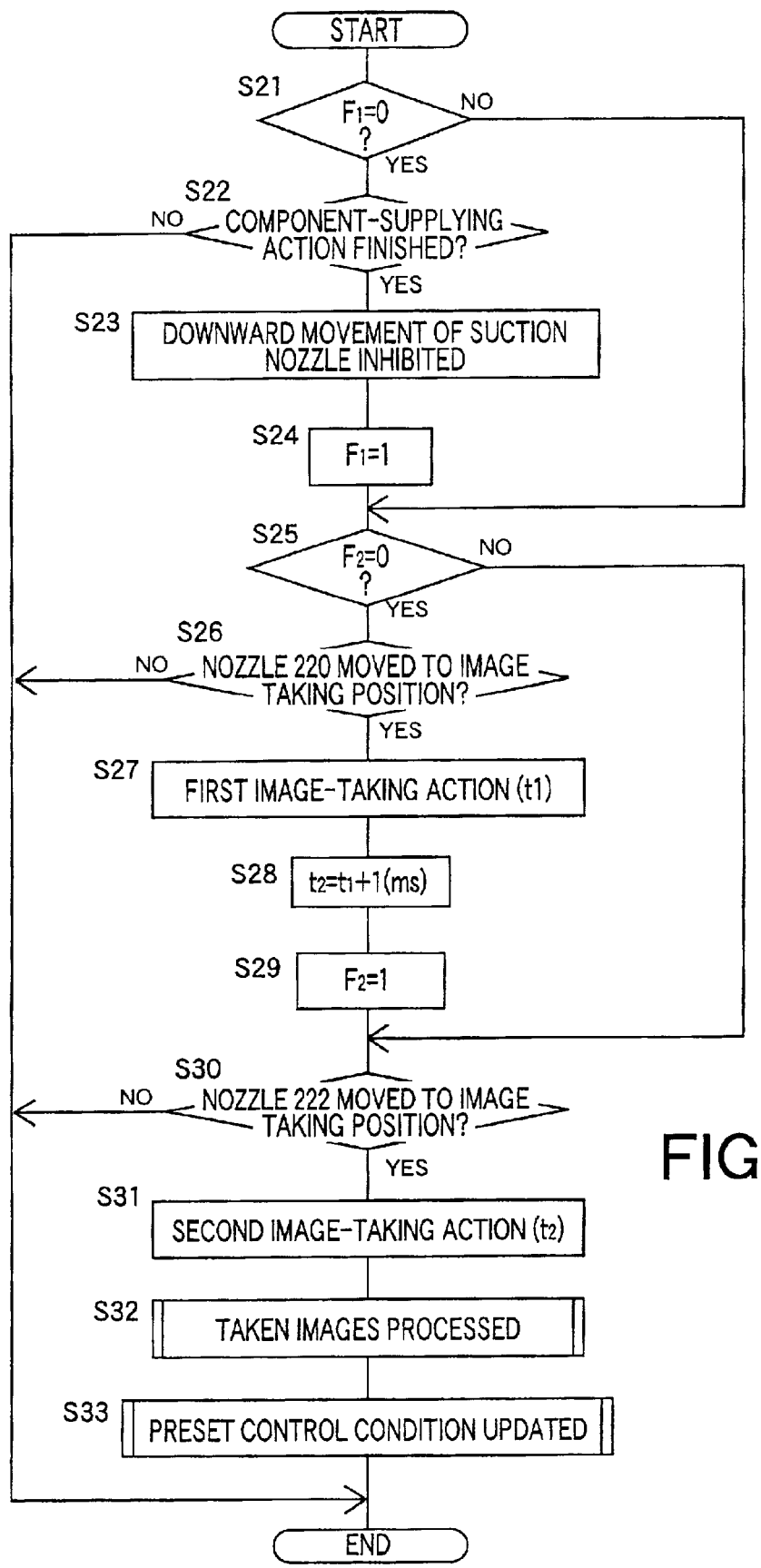
FIG. 6 is a flow chart representing another brightness detecting routine according to which a brightness is detected by the image taking system.

Hereinafter, there will be described in more detail the present brightness detecting routine by reference to the flow chart shown in FIG. 6.

If the timer indicates that the preset time has passed, and commands a commencement of the brightness detecting routine, the control device 200 waits, at S21 and S22, for ending of the current supplying operation to supply electronic components 28 to the current printed-wiring board 38 so that those components 28 are mounted on the board 38. After the component supplying operation has ended, the control goes to S23 to output a command that the two suction nozzles 70 which subsequently arrive at the component supplying position, must not hold an electronic component 28. More specifically described, each of the two suction nozzles 70 is inhibited, at the component supplying position, from moving downward to receive an electronic component 28. From this state, the indexing table 74 is rotated by one angular pitch, so that each of the two suction nozzles 70 is moved, without holding an electronic component 28, to the component-posture detecting position, i.e., the image taking position. Hereinafter, those two suction nozzles 220, 222 will be referred to as the inspection nozzles 220, 222. It is preferred that the suction nozzle 70 following the two inspection nozzles 220, 222 be moved downward, at the component supplying position, to receive an electronic component 28 as usual.

At S24, the control device sets a flag, $F_1$, to $F_1=1$. Thus, in one or more following control cycles according to this routine, S21 to S24 are skipped. At S25, the control device judges whether a flag, $F_2$, is set at $F_2=0$. If a positive judgment is made at S25, the control goes to S26 to judge whether the preceding one 220 of the two inspection nozzles 220, 222 as viewed in the rotating direction has arrived at the component-posture detecting position, i.e., the component-image taking position. If a positive judgment is made at S26, the control goes to S27 to perform a first image-taking action corresponding to the first image-taking action performed in the preceding embodiment. The first imagetaking action is performed under the currently effective value ($t_1=t_0$) of the shutter speed as one control parameter, and the thus taken image is sent to the control device 200. At S28, the current value of the shutter speed is varied to a different value ($t_2$) in the same manner as that employed in the preceding embodiment; and at S29, the control device sets the flag $F_2$ to $F_2=1$. Thus, in one or more following control cycles according to this routine, S25 to s29 are skipped. At S30, the indexing table 74 is rotated by one angular pitch, so that the following inspection nozzle 222 arrives at the component-image taking position. At S31, a second image-taking action is performed. At S31and S32, the control device 200 processes the thus taken two images in the same manner as that employed at S3 and S6 to S10 of the flow chart shown in FIG. 4. Thus, a new value of the shutter speed is determined and set. Since the image processing operation are identical with that performed in the preceding embodiment, no detailed description thereof is provided here.

In the present modified embodiment, the respective images of the two inspection nozzles 220, 222 are taken in the state in which each of the nozzles does not hold an electronic component 28. Thus, it is not needed to change the period or speed of rotation of the indexing table 74, and accordingly the two image-taking actions can be performed without interfering with the electronic-component mounting operation. However, it is possible to perform the brightness detecting operation during the electronic-component mounting operation. In the latter case, during the electronic-component mounting operation, two suction nozzles 70 are inhibited from holding respective electronic components 28. Since, however, the speed of rotation of the indexing table 74 need not be decreased, the lowering of efficiency of the electronic-component mounting operation can be minimized.

In the present embodiment, the brightness detection operation is performed by using the two suction nozzles 70 as the inspection nozzles 220, 222. However, it is possible to use only one suction nozzle 70. In the latter case, when the suction nozzle 70 as the inspection nozzle is positioned at the component-posture detecting position, the rotation speed at which the indexing table 74 is rotated by the rotating device is decreased, so that the suction nozzle 70 can stay for a time enough to perform two image-taking actions to detect respective brightness values of the thus taken two images. However, the time needed to perform the two image-taking actions is very short, and accordingly the lowering of efficiency of the electronic-component mounting operation can be minimized.

In the case where the computer of the control device 200 monitors or counts the total number of the electronic components 28 whose images have been taken by the image taking device 78, the brightness detecting routine may be started each time the total number counted by the computer exceeds a preset number.

In the present embodiment, the brightness detecting operation is periodically performed. However, the electronic-component mounting system may be so modified as to perform the brightness detecting operation when a brightness of a taken image is found to be higher than an upper-limit value of a preset range, or lower than a lower-limit value of the same. More specifically described, the mounting system may be so modified as to detect an average value of respective gray-scale values of respective picture elements of a specified portion of an image which is taken at a considerably short period during a usual electronic-component mounting operation. In this case, if the detected average gray-scale value falls within a preset range, the mounting system does not perform the brightness detecting operation; and, if the detected average gray-scale value does not fall within the preset range, the mounting system performs the brightness detecting operation to detect a brightness of a taken image as a whole. This image-brightness monitoring operation is performed concurrently with the component-image taking operation as part of the usual electronic-component mounting operation. Therefore, it is preferable to detect a brightness with respect to at least one portion of a taken image that corresponds to a bright background of an electronic component 28, irrespective of the sort of the component 28, more preferably, two or more portions of a taken image that correspond to a bright background.

Moreover, the present electronic-component mounting system may be so modified as to perform the brightness detecting operation when a suction nozzle 70 holding a specified sort of electronic component is positioned at the component-posture detecting position. In this case, the two CCD cameras 94, 96 may be subjected to the brightness detecting operation, at respective different timings. In particular, it is preferred that a CCD camera having a high magnification power be subjected to the brightness detecting operation using a suction nozzle 70 holding a small-size electronic component.

In each of the illustrated embodiments, the brightness detecting operation is performed such that one or two suction nozzles 70 not holding an electronic component 28 is or are imaged to obtain two images and, based on the thus obtained images, a brightness of a taken image is detected. However, it is possible to detect a brightness of a taken image based on an image taken in a state in which one or more suction nozzles 70 holds or each hold an electronic component 28. For example, the control device 200 detects, in the same manner as that employed in the preceding embodiments, an average gray-scale value of a remaining portion of a taken image that is other than a first portion thereof corresponding to an electronic component 28 as an object and a second portion thereof located along an outer periphery of the first portion. Therefore, it is preferred that the brightness detecting operation be performed in such a manner that a suction nozzle 70 holding a small-size electronic component 28 is selected and used to take an image whose large proportion is occupied by a bright background. In this modified embodiment, too, it is preferable to perform two image-taking actions while a single suction nozzle 70 whose images are to be taken to detect a brightness, stays at the component-image taking position. To this end, the speed of rotation of the indexing table 74 is lowered.

Figure 7:
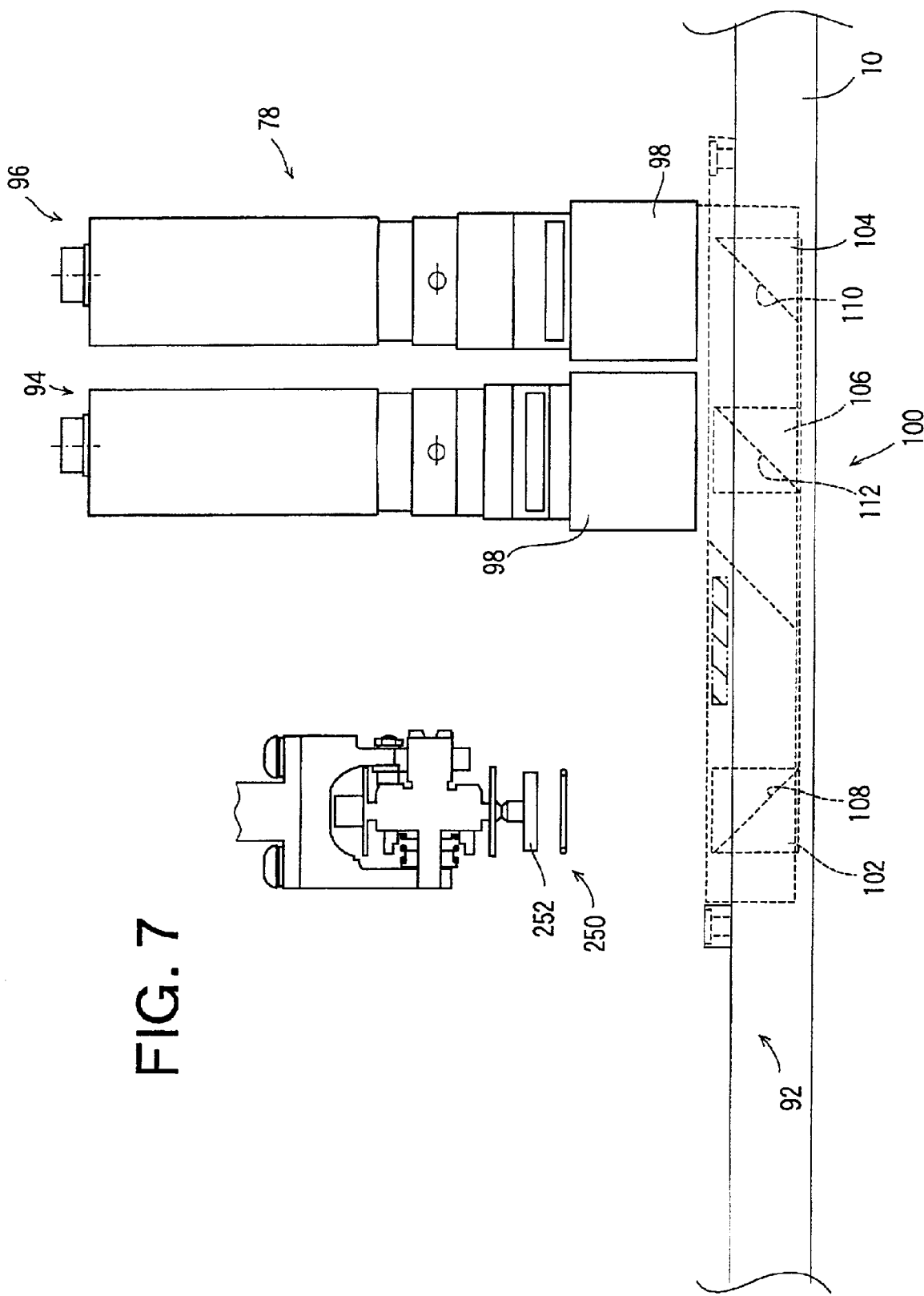
FIG. 7 is a side elevational view showing a portion of another image taking system.

In each of the illustrated embodiments, the illuminating device is provided in the form of a back-side illuminating device including the luminescent plate 90 and the ultraviolet-light emitting device 92. However, it is possible to employ, as the illuminating device, a front-side illuminating device 250, as shown in FIG. 7, that is provided between the two CCD cameras 94, 96 and an electronic component 28. The front-side illuminating device 250 illuminates a front side of the electronic component 28, i.e., the component's front surface whose image is to be taken by the CCD camera 94 or 96.

When an image taking device (not shown) including the front-side illuminating device 250 is subjected to a brightness detecting operation, it is preferred that a suction nozzle 70 be controlled to hold an inspection chip 252 having so large a surface that the image taking device can take a sufficiently bright image of the surface. It is also preferred that the bright detecting operation be performed at a timing when it does not interfere with the current electronic-component mounting operation.

In the above-indicated case, i.e., in the case where the image taking device including the front-side illuminating device 250 is subjected to the brightness detecting operation, it is possible to perform two image-taking actions in a state in which the suction nozzle 70 holds an electronic component 28, in the same manner as that employed in the illustrated embodiments, and determine an average of respective gray-scale values of respective picture elements of each taken front-surface image of the electronic component 28. In this modified embodiment, the images of the electronic component 28 itself are taken during the electronic-component mounting operation. To this end, it is preferred to select and utilize an electronic component 28 having a large and optically uniform surface whose image is to be taken in the brightness detecting operation.

The previously-described image taking device 78 may be employed in a different sort of electronic-component mounting system.

Figure 8:
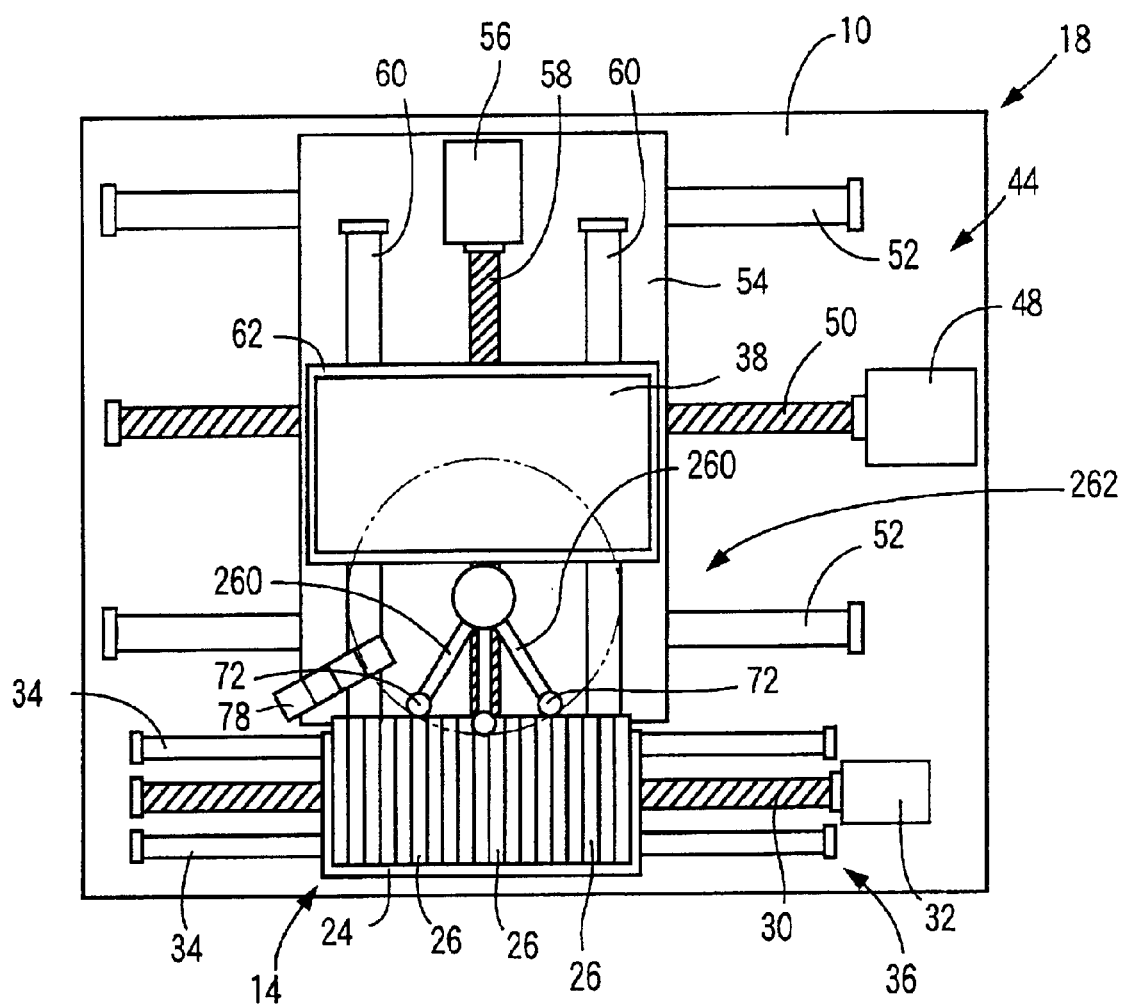
FIG. 8 is a plan view schematically showing another electronic-component mounting system including another image taking system.

For example, the image taking device 78 may be employed in an electronic-component mounting system, shown in FIG. 8, which includes a plurality of rotary members 260 each of which is rotatable about a common axis line. In this case, a cam device (not shown) applies a rotary motion to each of the rotary members, according to a prescribed velocity pattern, such that the plurality of rotary members are stopped a plurality of stop positions, respectively, at different timings. The present mounting system includes a mounting device 262 including a plurality of component holders 72 which are supported by the plurality of rotary members 260, respectively, such that each of the holders 72 is rotatable about its vertical axis line and is movable relative to the corresponding rotary member 260 in its axial direction parallel to the axis line. The electronic-component mounting device 262 is similar in construction to the electronic-component mounting device disclosed in Japanese Patent Document No. 9-237997 or its corresponding U.S. Pat. No. 5,926,950, and the remaining portion of the present mounting system has the same construction as that of the electronic-component mounting system shown in FIGS. 1 to 3. Thus, the same reference numerals as used in the mounting system shown in FIGS. 1 to 3 are used to designate the corresponding elements and parts of the mounting system shown in FIG. 8, and the description thereof is omitted.

When, in the present electronic-component mounting system, the control device 200 outputs a command to perform a brightness detecting operation for the image taking device 78, the mounting system waits for ending of a component supplying operation to supply electronic components 28 for the current electronic-component mounting operation being effected on the printed-wiring board 38. If the component supplying operation ends, the suction nozzle 70 which is to be next moved to the component supplying position, is not stopped at the component supplying position, and is moved to the component-posture detecting position, without receiving an electronic component 28. Hereinafter, this suction nozzle 70 will be referred to as the inspection nozzle 220. After the inspection nozzle 220 arrives at the image taking position, the image taking device 68 performs two image-taking actions, in the same manner as that employed in the preceding embodiments, and the control device 200 updates a shutter speed based on a brightness of the taken images.

In the present electronic-component mounting system, the plurality of rotary members 260 can be rotated and stopped, independent of each other. Therefore, a rotation speed, a stop position, and/or a stop duration of the rotary member 260 supporting the inspection nozzle 220 can be so adjusted that a brightness detecting operation may be performed without delaying respective timings of operation of the other rotary members 260. More specifically described, the inspection nozzle 220 can be rotated without being stopped at the component supplying position, and can be stopped at the image taking position for a time duration long enough to perform two image-taking actions.

Figure 9:
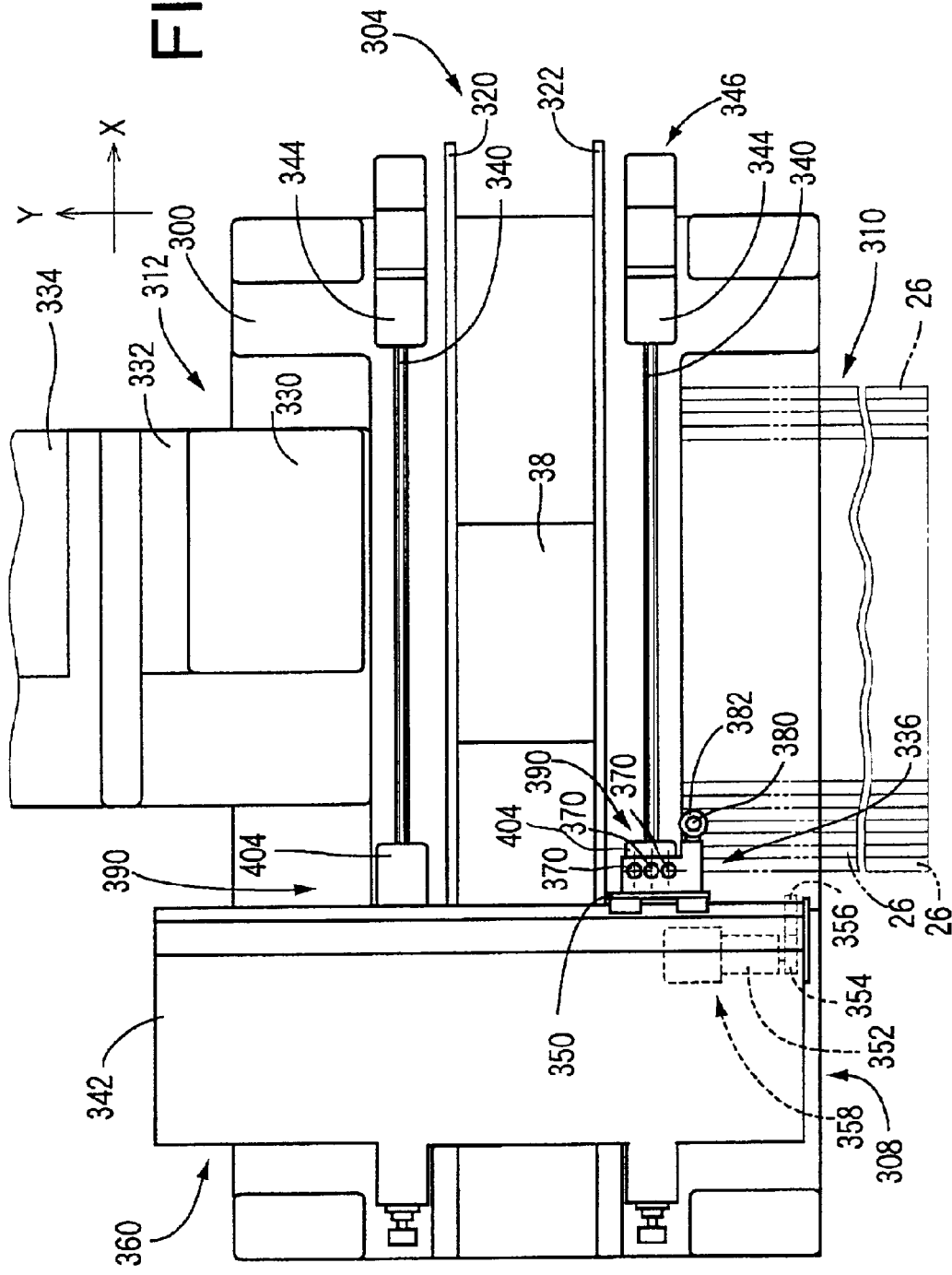
FIG. 9 is a plan view schematically showing another electronic-component mounting system including another image taking system.
Figure 10:
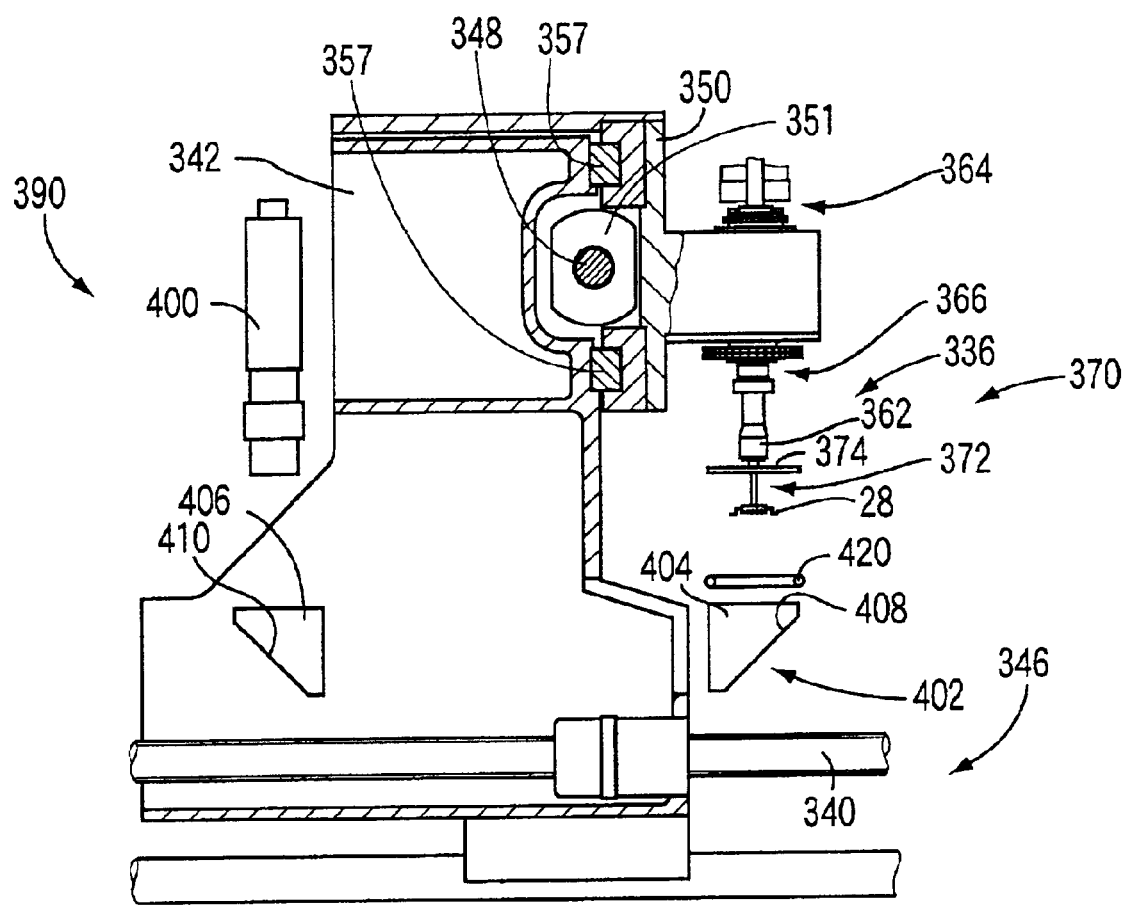
FIG. 10 is an enlarged, side elevational view of the image taking system shown in FIG. 9.

The principle of the present invention is applicable to an image taking system employed in a different sort of electronic-component mounting system shown in FIGS. 9 and 10.

However, since this system has a substantially same construction as that of the system disclosed in U.S. patent application Ser. No. 10/041,624 assigned to the assignee of the present application, this system will be described only briefly.

Referring to FIGS. 9 and 10, reference numeral 300 denotes a machine base of the present electronic-component mounting system. This mounting system includes a printed-wiring board conveyor (PWB conveyor) 304, a component mounting device 308 and two component supply devices 310, 312, all of which are mounted on the machine base 300. The PWB conveyor 304 is arranged to transfer a circuit substrate or a printed board in the form of a printed-wiring board 38 in an X-axis direction (in the left and right directions as seen in FIG. 9). The component mounting device 308 is arranged to mount electric components in the form of electronic components on the printed-wiring board 38. The component supply devices 310, 312 are arranged to supply the component mounting device 308 with the electronic components.

In the present embodiment, the printed-wiring board 38 is transferred by the PWB conveyor 304 such that the printed-wiring board 38 maintains a horizontal attitude or posture. The printed-wiring board 38 is stopped by a suitable stopper device (not shown), to be located at a predetermined component-mounting position. The board 38 located at the component-mounting position is supported by a printed-board support device in the form of a printed-wiring board support device (not shown). In the present electronic-component mounting system, the printed-wiring board 38 is supported such that a component-mounting surface of the board 38 on which the electronic components are to be mounted is parallel to a horizontal plane. The above-indicated X-axis direction in which the board 38 is transferred by the PWB conveyor 304, is parallel to an X axis of an XY coordinate system provided in an XY plane parallel to the horizontal component-mounting surface of the board 38.

The printed-wiring board conveyor or PWB conveyor 304 is provided with a pair of guide rails 320, 322. One of the guide rails 320, 322 is a stationary guide rail fixed on the machine base 300, while the other guide rail is a movable guide rail which is movable toward and away from the stationary guide rail, to change a distance between the stationary and movable guide rails, depending upon the width of the PWB conveyor 304, which is a dimension as measured in a Y-axis direction perpendicular to the X-axis direction in which the PWB conveyor 304 is moved.

Each of the two guide rails 320, 322 is constructed to guide an endless conveyor belt such that the conveyor belt can travel in a hoop. The printed-wiring board 12 is placed on the conveyor belts, and is transferred by the conveyor belts when the conveyor belts are rotated in synchronization with each other by a drive source in the form of a printed-wiring board feed motor (PWB feed motor).

The component supply devices 310, 312 are spaced from each other in the Y-axis direction perpendicular to the X-axis direction, and located on the opposite sides of the PWB conveyor 304. In the present embodiment, the component supply device 310 is of tape feeder type, while the component supply device 312 is of tray type. The component supply device 310 of tape feeder type includes a multiplicity of tape feeders 26 which are arranged in the X-axis direction. Each tape feeder 26 has a tape cartridge arranged to feed a carrier tape which accommodates electronic components.

The component supply device 312 of tray type includes a multiplicity of component trays 330 accommodating electronic components. The component trays 330 are accommodated in respective multiple tray boxes 332, which are vertically arranged and are supported by respective support members (not shown). The tray boxes 332 are elevated one after another by an elevator device disposed within a column 334, to a predetermined component-supply position. For a component holding device in the form of a component mounting head 336 (which will be described) of the component mounting device 308 to receive the electronic components from the component tray 330 in the tray box 332 located at the component-supply position, some space must be kept above the component-supply position.

To provide this space, the tray box 332 from which the electronic components have been transferred to the component holding device is moved further upwards from the component-supply position to a predetermined retracted position when the next tray box 332 is moved to the component-supply position, so that the required space is provided between the component-supply position and the retracted position. The component supply device 312 of tray type is identical in construction to a component supply device disclosed in Japanese Patent Document No. 2-57719.

The component mounting head 336 of the component mounting device 308 is movable in the mutually perpendicular X-axis and Y-axis directions, so that the mounting head 336 can take a linear movement having X-axis and Y-axis components, to move an electronic component 28 to a desired position on or above the component-mounting surface of the printed-wiring board 38. To move the component mounting head 336 in the X-axis direction, the component mounting device 308 includes two ballscrews 340 disposed on the machine base 300, on the opposite sides of the PWB conveyor 304, so as to extend in the X-axis direction, and an X-axis slide 342 having two ballnuts which engage the respective ballscrews 340. The mounting device 308 further includes two X-axis drive motors 344 for rotating the two ballscrews 340, for moving the X-axis slide 342 in the X-axis direction. The X-axis slide 342 extends in the Y-axis direction across the PWB conveyor 304, and has a length corresponding to the distance between the component supply device 312 of feeder type and the component supply device 312 of tray type. On the machine base 300, there are disposed two guide rails located under the respective ballscrews 340. The X-axis slide 342 has two guide blocks which slideably engage the two guide rails, respectively, for guiding the X-axis slide 342 in the X-axis direction. It will be understood that the ballscrews 340, ballnuts, and X-axis drive motors 344 cooperate with one another to constitute an X-axis drive device 346.

On the X-axis slide 342, there is disposed a feed screw in the form of a ballscrew 348 which extends in the Y-axis direction. The X-axis slide 342 carries a Y-axis slide 350 having a ballnut 351 which engages the ballscrew 348. The ballscrew 348 is rotated by a Y-axis drive motor 352 through gears 354, 356, so that the Y-axis slide 350 is moved in the Y-axis direction while being guided by a pair of guide rails 357. It will be understood that the ballscrew 348, ballnut 351, and Y-axis drive motor 352 constitute a Y-axis drive device 358, and that the Y-axis drive device 358 cooperates with the X-axis slide 342, X-axis drive device 346, and Y-axis slide 350, to constitute an XY moving device 360 for moving the component mounting head 336 to a desired position in the horizontal XY plane.

The Y-axis slide 350 has an upright side surface on which there is mounted the above-indicated component mounting head 336. The component mounting head 336 in the present electronic-component mounting system includes three component mounting units 370 that are disposed on the Y-axis slide 350 such that the units 370 are arranged in a row in the Y-axis direction. Each of the three mounting units 370 includes a component holder 362, a Z-axis drive device 364 for moving up and down the component holder 362 in a Z-axis direction, and a rotary drive device 366 for rotating the component holder 362 about its vertical axis line. However, the mounting units 370 of the mounting head 336 may be arranged in a different manner, and a different number of mounting units 370 (e.g., a single mounting unit 370) may be employed.

Each of the component holders 362 employed in the present embodiment will be described by reference to FIG. 10. However, only one component holder 362 is shown in FIG. 10. The component holder 362 includes a suction nozzle 372 and a luminescent plate 374. An illuminating device for illuminating an electronic component 28 held by the component holder 362, and an image taking device for taking an image of the component 28 held by the holder 362 will be described later.

The mounting head 336 carries a stationary image-taking device in the form of a fiducial mark camera 380 operable to take an image of each of fiducial marks affixed to the printed-wiring board 38, as shown in FIG. 9. In the present embodiment, the fiducial mark camera 380 is a CCD camera including CCDs (charge-coupled devices) and a lens system and capable of taking a two-dimensional image of an object. An illuminating device 382 is provided to illuminate each fiducial mark on the board 38, and its vicinity, when the image of the fiducial mark is taken by the fiducial mark camera 380.

The X-axis slide 342 is provided with two stationary image-taking devices 390, which are disposed at respective Y-axis-direction positions at which the respective two ballscrews 340 are disposed. Namely, one of the two image-taking devices 390 is located between the component supply device 310 of feeder type and the PWB conveyor 304 (or the printed-wiring board 38 placed thereon), while the other image-taking device 390 is located between the component supply device 312 of tray type and the PWB conveyor 304. The two image-taking devices 390 are identical in construction with each other.

Each image-taking device 390 includes a component camera 400 for taking an image of the electronic component 28, and a light guiding device 402. The light guiding device 402 includes a reflecting device in the form of reflecting mirrors 404, 406, which are attached through respective brackets to the underside of the X-axis slide 342. One 404 of the two reflecting mirrors 404, 406 is disposed at a position right below a path of movement of the component mounting head 336 in the Y-axis direction, and has a reflecting surface 408 which is inclined about 45 degrees with respect to a vertical plane including the centerline of the suction nozzle 364, such that one of the opposite ends of the reflecting surface 408 (as viewed in the X-axis direction) which is closer to the X-axis slide 342 is the lower end, that is, the left end of the reflecting surface 408 is the lower end.

The other reflecting mirror 406 is disposed on the side of the X-axis slide 342 which is remote from the reflecting mirror 404, and has a reflecting surface 410 which is inclined with respect to the vertical plane, symmetrically with the reflecting surface 408. The component camera 400 for taking the image of the electronic component 28 held by the suction nozzle 364 is located on the side of the X-axis slide 342 remote from the component mounting head 336, such that the component camera 400 faces downward toward the reflecting surface 408 of the reflecting mirror 404. In this arrangement, the image of the electronic component 28 held by the suction nozzle 364 can be taken by the component camera 400 when the component mounting head 336 is moved by the XY moving device 360 to the Y-axis position of the corresponding ballscrew 340 at which the electronic component 28 is located right above the reflecting mirror 404. Thus, the image-taking device 390 is arranged to image the electronic component 28 located at a predetermined image-taking position which lies within a path of movement of the electronic component 28 when the Y-axis slide 350 is moved in the Y-axis direction relative to the X-axis slide 342. In the present embodiment, the component camera 400 is a two-dimensional CCD camera, like the fiducial mark camera 380 described above. The reflecting mirror 406 may be eliminated. In this case, the component camera 400 is disposed so as to have a horizontal attitude and face toward the reflecting mirror 404. At least one of the fiducial camera 380 and the component camera 400 may be provided by a line scanning camera.

An ultraviolet-light emitting device 420 is disposed near the reflecting mirror 404, for emitting an ultraviolet light toward the luminescent plate 366 of the suction nozzle 364. The luminescent plate 366 absorbs the ultraviolet light, and emits a visible light for illuminating a top surface of the electronic component 28 held by the suction nozzle 364. The component camera 400 takes a silhouette image of the electronic component 28 in the axial direction of the suction nozzle 364, with the luminescent plate 366 used as a light background. In the present embodiment, too, the ultraviolet-light emitting device 420 and the luminescent plate 366 cooperate with each other to provide an illuminating device in the form of a back-side illuminating device which illuminates a back side of the electronic component 28.

Next, there will be described an image-brightness detecting operation of the electronic-component mounting system constructed as described above.

In the present embodiment, the back-side illuminating device is employed as the illuminating device. Therefore, an image of the component holder 362 not holding an electronic component 28 is taken, and a brightness detection operation is performed based on the thus taken image. Thus, it is preferred that the brightness detecting operation be performed when the electronic-component mounting system is checked up before the operation thereof is started, when a printed-wiring board 38 is carried in, or carried out, or at other timings when the brightness detecting operation does not interfere with an electronic-component mounting operation. In the same manner as that employed in each of the illustrated embodiments, if a predetermined time has elapsed and the current electronic-component mounting operation has completed, the current printed-wiring board 38 is carried out and a new board 38 is carried in. Concurrently with the carrying-in and carrying-out of the current and new printed-wiring boards 38, the component mounting head 336 not holding an electronic component 28 is moved to the component-image taking position. In this state, in the same manner as that employed in each of the illustrated embodiments, two image-taking actions are performed, and a new value of the control parameter is determined based on the thus taken images. However, in the present embodiment, too, it is possible to perform a brightness detecting operation in a state in which the component holder 362 holds an electronic component 28. In this case, the brightness detecting operation may be performed concurrently with the current electronic-component mounting operation in which electronic components 28 are mounted on the current printed-wiring board 38.

The present electronic-component mounting system may employ a front-side illuminating device as the illuminating device for illuminating the electronic component 28. In the case where a brightness of an image taken by an image taking device including the front-side illuminating device is detected, it is preferred that, in the same manner as that employed in the embodiment shown in FIG. 7, the suction nozzle 364 be controlled to hold a test chip 252 having so large a surface that a substantially entire portion of a taken image of that surface is bright, and that a brightness detecting operation be performed based on the thus taken image. In this case, it is also preferred that the brightness detecting operation be performed at a timing when it does not interfere with the current electronic-component mounting operation.

In the above-indicated case where the image taking device including the front-side illuminating device is subjected to a brightness detecting operation, it is possible to perform, in the same manner as that employed in each of the illustrated embodiments, two image-taking actions, however, in a state in which the suction nozzle 364 holds an electronic component 28, and determine an average of respective gray-scale values of respective picture elements of each taken front image of the electronic component 28. Thus, in the present modified embodiment, in order to perform a brightness detecting operation, an image of an electronic component 28 itself is taken concurrently with the current electronic-component mounting operation. To this end, it is preferred to select and use such an electronic component 28 having a large and optically uniform surface whose image is to be taken.

In the present electronic-component mounting system, the fiducial-mark camera 380 may be subjected to a brightness detecting operation. The fiducial-mark camera 380 takes respective images of the fiducial marks provided on the printed-wiring board 38 and, basically, those taken images of the fiducial marks are used to detect positions of the board 28. However, based on a batch of image data including the image of each fiducial mark, a brightness detecting operation can be performed. More specifically described, an average brightness of a remaining portion of each taken image from which an image of each fiducial mark is excluded, is determined as the brightness of the image. This brightness detecting operation can be performed concurrently with the electronic-component mounting operation.

When the fiducial-mark camera 380 is subjected to the brightness detecting operation, the camera 380 may take an image of not the printed-wiring board 38 but a different thing. For example, it is possible to provide, on each of the two guide rails 320, 322, a inspection surface whose image is taken to detect a brightness thereof. In this case, it is preferred that the inspection surface be optically uniform and be larger than the image-forming area of the fiducial-mark camera 380. In the case where a brightness of an image of an object other than the printed-wiring board 38 is detected in a brightness detecting operation, it is preferred to perform the operation at a timing when it does not interfere with the electronic-component mounting operation.

While some embodiments of this invention and some modifications thereof have been described in detail, for illustrative purposes only, it is to be understood that the present invention may be embodied with various other changes, modifications and improvements, such as those described in SUMMARY OF THE INVENTION, which may occur to a person skilled in the art, without departing from the spirit and scope of the invention defined in the appended claims.

What is claimed is:

1. An electric-component mounting system comprising:
   a substrate supporting device which supports a circuit substrate;
   a component supplying device which supplies an electric component;
   a component mounting device including a suction nozzle which receives the electric component supplied by the component supplying device, and mounts the component on the circuit substrate supported by the substrate supporting device;
   at least one of (a) a mark-image taking device which takes an image of at least one fiducial mark provided on the circuit substrate supported by the substrate supporting device and (b) a component-image taking device which takes an image of the electric component held by the suction nozzle;
   a processing and controlling device which includes a data processing portion that processes image data representing the image taken by said at least one of the mark-image taking device and the component-image taking device, and which modifies, based on a result of processing of the image data by the data processing portion, a predetermined component-mounting program, and controls, according to the modified component-mounting program, the mounting of the electric component by the component mounting device on the circuit substrate;
   said at least one of the mark-image taking device and the component-image taking device comprising
   an illuminating device including a light source which emits a light for illuminating an object, and
   a camera which takes an image of the object,
   at least one of the camera and the illuminating device comprising a brightness controlling device which controls a brightness of an image taken by the camera; and
   the processing and controlling device comprising
   a brightness detecting portion which detects a brightness of at least a portion of the image of the object taken by the camera, and
   a control-parameter varying portion which varies, based on the brightness detected by the brightness detecting portion, at least one control parameter of the brightness controlling device so that a brightness of at least a portion of an image taken by the camera is equal to a preset brightness.

2. The electric-component mounting system according to claim 1, wherein the brightness controlling device comprises a camera controlling portion which controls at least one of a shutter speed of the camera, an amount of opening of a diaphragm of the camera, and a gain of an amplifier of the camera.

3. The electric-component mounting system according to claim 1, wherein the brightness controlling device comprises a light-source controlling portion which controls at least one of an electric voltage applied to the light source and an electric current supplied to the light source.

4. The electric-component mounting system according to claim 1, wherein the illuminating device comprises a back-side illuminating device which illuminates a back side of the object and the camera takes a silhouette image of the object, and wherein the brightness detecting portion detects a brightness of at least a portion of a bright background of the silhouette image taken by the camera.

5. The electric-component mounting system according to claim 4, wherein the brightness detecting portion detects an average brightness of the bright background of the silhouette image.

6. The electric-component mounting system according to claim 1, wherein the illuminating device comprises a front-side illuminating device which illuminates a front side of the object and the camera takes a front image of the object that is formed by a light reflected from the front side of the object, and wherein the brightness detecting portion detects a brightness of at least a portion of a bright object-corresponding portion of the front image of the object taken by the camera.

7. The electric-component mounting system according to claim 6, wherein the brightness detecting portion detects an average brightness of the bright object-corresponding portion of the front image of the object.

8. The electric-component mounting system according to claim 1, wherein the brightness detecting portion detects, as said brightness, an average of respective gray-scale values of respective picture elements of said portion of the image of the object taken by the camera.

9. The electric-component mounting system according to claim 1, wherein the illuminating device comprises
   the light source which emits an ultraviolet light; and
   a fluorescent surface which is provided in back of the object and which absorbs the ultraviolet light and emits a visible light toward the camera.

10. The electric-component mounting system according to claim 1, wherein the control-parameter varying portion comprises
    an inspecting portion which operates the brightness controlling device under each of a plurality of different inspection values of the control parameter, so that the camera takes an image under said each of the different inspection values of the control parameter; and a relationship determining portion which determines, based on a brightness of at least a portion of each of the respective images taken by the camera under the different inspection values of the control parameter, a relationship between brightness and control parameter, wherein the control-parameter varying portion determines, according to said relationship, a value of the control parameter of the brightness controlling device so that a brightness of at least a portion of an image taken by the camera under the determined value of the control parameter is equal to the preset brightness.

11. The electric-component mounting system according to claim 10, wherein the inspecting portion operates the brightness controlling device under said each of the different inspection values of the control parameter that include a currently effective value of the control parameter and a value that differs by a preset amount from the currently effective value in a direction to increase a brightness of at least a portion of an image taken by the camera.

12. The electric-component mounting system according to claim 1, wherein the brightness controlling device comprises a shutter of the camera, and wherein said at least one control parameter comprises a shutter speed of the camera.

* * * * *